United States Patent
Pandit et al.

(10) Patent No.: US 11,699,623 B2
(45) Date of Patent: Jul. 11, 2023

(54) SYSTEMS AND METHODS FOR ANALYZING DEFECTS IN CVD FILMS

(71) Applicant: Applied Materials, Inc., Santa Clara, CA (US)

(72) Inventors: Mandar B. Pandit, Milpitas, CA (US); Man-Ping Cai, Saratoga, CA (US); Wenhui Li, San Jose, CA (US); Michael Wenyoung Tsiang, Milpitas, CA (US); Praket Prakash Jha, San Jose, CA (US); Jingmin Leng, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 226 days.

(21) Appl. No.: 17/070,751

(22) Filed: Oct. 14, 2020

(65) Prior Publication Data

US 2022/0115275 A1    Apr. 14, 2022

(51) Int. Cl.
| | |
|---|---|
| *H01L 21/66* | (2006.01) |
| *H01L 21/02* | (2006.01) |
| *C23C 16/52* | (2006.01) |
| *C23C 16/40* | (2006.01) |
| *H01L 21/67* | (2006.01) |

(52) U.S. Cl.
CPC ........... *H01L 22/20* (2013.01); *C23C 16/401* (2013.01); *C23C 16/52* (2013.01); *H01L 21/02164* (2013.01); *H01L 21/67288* (2013.01)

(58) Field of Classification Search
None
See application file for complete search history.

(56) References Cited

U.S. PATENT DOCUMENTS

| | | | |
|---|---|---|---|
| 6,456,951 B1 * | 9/2002 | Maeda | ............... H01L 22/20 |
| | | | 702/81 |
| 7,079,975 B1 | 7/2006 | Halliyal et al. | |
| | | (Continued) | |

FOREIGN PATENT DOCUMENTS

WO    2020-011507 A1    1/2020

OTHER PUBLICATIONS

International Search Report and Written Opinion dated Feb. 3, 2022 in International Patent Application No. PCT/US2021/054356, 9 pages.

*Primary Examiner* — Asok K Sarkar
(74) *Attorney, Agent, or Firm* — Kilpatrick Townsend & Stockton LLP

(57) ABSTRACT

Embodiments of the present technology may include semiconductor processing methods that include depositing a film of semiconductor material on a substrate in a substrate processing chamber. The deposited film may be sampled for defects at greater than or about two non-contiguous regions of the substrate with scanning electron microscopy. The defects that are detected and characterized may include those of a size less than or about 10 nm. The methods may further include calculating a total number of defects in the deposited film based on the sampling for defects in the greater than or about two non-contiguous regions of the substrate. At least one deposition parameter may be adjusted as a result of the calculation. The adjustment to the at least one deposition parameter may reduce the total number of defects in a deposition of the film of semiconductor material.

20 Claims, 6 Drawing Sheets

(56) References Cited

U.S. PATENT DOCUMENTS

| | | |
|---|---|---|
| 2005/0152594 A1 | 7/2005 | Jau et al. |
| 2006/0157697 A1 | 7/2006 | Nagano |
| 2010/0062224 A1 | 3/2010 | Witvrouw et al. |
| 2013/0294677 A1* | 11/2013 | Urano .................. G01N 21/956 |
| | | 382/141 |
| 2017/0328842 A1 | 11/2017 | Otani et al. |
| 2019/0067060 A1* | 2/2019 | Plihal .................... G06T 7/0006 |
| 2020/0232094 A1 | 7/2020 | Schuster et al. |
| 2021/0396692 A1* | 12/2021 | Fukuda ................. G06T 7/0006 |

* cited by examiner

SYSTEMS AND METHODS FOR ANALYZING DEFECTS IN CVD FILMS

TECHNICAL FIELD

The present technology relates to semiconductor systems, processes, and methods. More specifically, the present technology relates to semiconductor systems and methods for detecting and analyzing defects in films formed by chemical vapor deposition.

BACKGROUND

Integrated circuits are made possible by processes which produce intricately patterned material layers on substrate surfaces. Improvements in chip performance, power, and area/cost are continuously sought. Chemical vapor deposition (CVD) in semiconductor manufacturing processing techniques has played a central role in forming ever smaller semiconductor devices, layers, and lines of integrated circuits. As the features on integrated circuits continue to decrease, smaller-sized defects in the deposition and treatment of CVD materials making the features become more significant to device operation, lifetime, performance, and yield, among other factors affecting semiconductor device quality and cost.

Integrating metrology into process systems and chambers may improve chip properties and yield. However, as semiconductor device sizes and device defects get smaller, it becomes more challenging for metrology to detect the defects. In many instances detecting smaller defects requires metrology systems and methods to have a tighter focus on the substrate features, which can increase the time and complexity to inspect all the relevant areas of the substrate.

Thus, there is a need for improved metrology systems and methods that can be used to measure smaller defects in the deposition and treatment of CVD materials, and to provide analysis in real-time to adjust the CVD parameters as needed. These and other needs are addressed by the present technology.

SUMMARY

The present technology includes embodiments of systems and methods to sample defects in films deposited on semiconductor substrates using chemical vapor deposition (CVD). In embodiments, the systems and methods may include scanning selected portions of the CVD material with scanning electron microscopy to detect defects less than or about 10 nm in size. The defect sampling may be incorporated into an analysis that calculates the total number of defects across a surface of the CVD material. The analysis may be used to make adjustments in one or more deposition parameters in order to reduce the number of defects generated by the CVD process. In some embodiments, these adjustments may be made without manual control through inputs to one or more controllers in the CVD system.

Embodiments of the present technology may include semiconductor processing methods that include depositing a film of semiconductor material on a substrate in a substrate processing chamber. The deposited film may be sampled for defects at greater than or about two non-contiguous regions of the substrate with scanning electron microscopy. The defects that are detected and characterized may include those of a size less than or about 10 nm. The methods may further include calculating a total number of defects in the deposited film based on the sampling for defects in the greater than or about two non-contiguous regions of the substrate. At least one deposition parameter may be adjusted as a result of the calculation. Deposition parameters may be chosen from deposition temperature, deposition pressure, an amount of spacing between the substrate and a showerhead in the substrate processing chamber, and a flow rate ratio of two or more deposition precursors. The adjustment to the at least one deposition parameter may reduce the total number of defects in a deposition of the film of semiconductor material.

In additional embodiments, the adjustment of at least one deposition parameter may reduce the total number of defects in a subsequently deposited film of the semiconductor material by greater than or about 80%. In still additional embodiments, the sampled film of semiconductor material may be characterized by a calculated total number of defects greater than or about 10,000, and the adjustment of at least one deposition parameter may reduce the calculated total number of defects in a subsequently-deposited film of the semiconductor material to less than or about 2000. In further embodiments, the adjustment of the at least one deposition parameter reduces an average surface roughness in a subsequently deposited film of the semiconductor material by greater than or about 50%. In yet further embodiments, the non-contiguous regions that are sampled for defects in the deposition film may be characterized by a field of view greater than or about 5 μm. In still further embodiments, the substrate upon which the film of semiconductor material is deposited may be a planar substrate. In still additional embodiments, the deposited film may include a silicon-containing dielectric material. In yet additional embodiments, the deposited film of semiconductor material may be characterized by a thickness of less than or about 50 Å.

Embodiments of the present technology may also include semiconductor processing methods that include depositing a film of silicon oxide on a substrate in a substrate processing chamber. In embodiments, the silicon oxide film is characterized by a thickness of less than or about 50 Å. The methods may further include sampling for defects in the deposited silicon oxide film at greater than or about two non-contiguous regions of the substrate with scanning electron microscopy. In embodiments, the defects are characterized by a size less than or about 10 nm. The methods may still further include adjusting at least one deposition parameter chosen from deposition temperature, deposition pressure, an amount of spacing between the substrate and a showerhead in the substrate processing chamber, and a flow rate ratio of two or more deposition precursors. In embodiments, the adjustment to the at least one deposition parameter reduces the number of defects sampled in a subsequent deposition of the silicon oxide film.

In additional embodiments, the deposited silicon oxide layer is sampled for defects in the absence of an over layer that increases the size of the defects. In still additional embodiments, the deposited silicon oxide layer is sampled for defects before a post-deposition anneal of the silicon oxide layer. In further embodiments, the greater than or about two non-contiguous regions of the substrate that are sampled may be planar regions of the substrate. In still further embodiments, the sampled silicon oxide film may be characterized by a total number of defects greater than or about 20,000, and the adjustment to the at least one deposition parameter reduces the total number of defects in a subsequently-deposited silicon oxide film to less than or about 1000. In yet additional embodiments, the deposition parameters that are adjusted to reduce the number of defects may include reducing the deposition pressure and increasing the flow rate ratio of the silicon-containing precursor to a non-silicon-containing precursor.

Embodiments of the present technology may further include semiconductor processing systems that include a deposition chamber to deposit a film of semiconductor material on a substrate in the deposition chamber. The systems may further include a defect sampling unit that includes a scanning electron microscope. In embodiments, the defect sampling unit may be operable to receive the substrate with the deposited film of semiconductor material and sample the substrate for defects in the deposited film at greater than or about two non-contiguous regions of the substrate. In additional embodiments, the system may include a control unit in electronic communication with the deposition chamber to control one or more deposition parameters chosen from deposition temperature, deposition pressure, an amount of spacing between the substrate and a showerhead in the substrate processing chamber, and a flow rate ratio of two or more deposition precursors. The control unit may adjust at least one of the deposition parameters in response to a number of defects in the deposited film of semiconductor material detected by the defect sampling unit so that a subsequent deposition of the film of semiconductor material has a reduced number of defects.

In additional embodiments, the defects in the film of semiconductor material that are sampled by the defect sampling unit may be characterized by a size less than or about 10 nm. In further embodiments, the non-contiguous regions that are sampled for defects by the defect sampling unit may be characterized by a field of view greater than or about 5 µm. In still further embodiments, the defect sampling unit may sample the substrate at greater than or about ten non-contiguous regions that are equally spaced from each other around the substrate. In additional embodiments, the sampled non-contiguous regions of the substrate may be planar regions. In some embodiments, the defect sampling unit may further include programmable logic that calculates a total number of defects in the deposited film on the substrate based on a number of sampled defects detected by the defect sampling unit. In embodiments, the control unit may adjust the at least one of the deposition parameters in response to the total number of defects calculated by the programmable logic of the defect sampling unit.

Such technology may provide numerous benefits over conventional systems and techniques. Embodiments of the systems and processing methods may provide detection and analysis of defects in deposited films that may be less than or about 10 nm in size. The systems and methods may also calculate a total number of these small defects across a substrate with greater accuracy and in shorter times than is possible using conventional metrology techniques. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
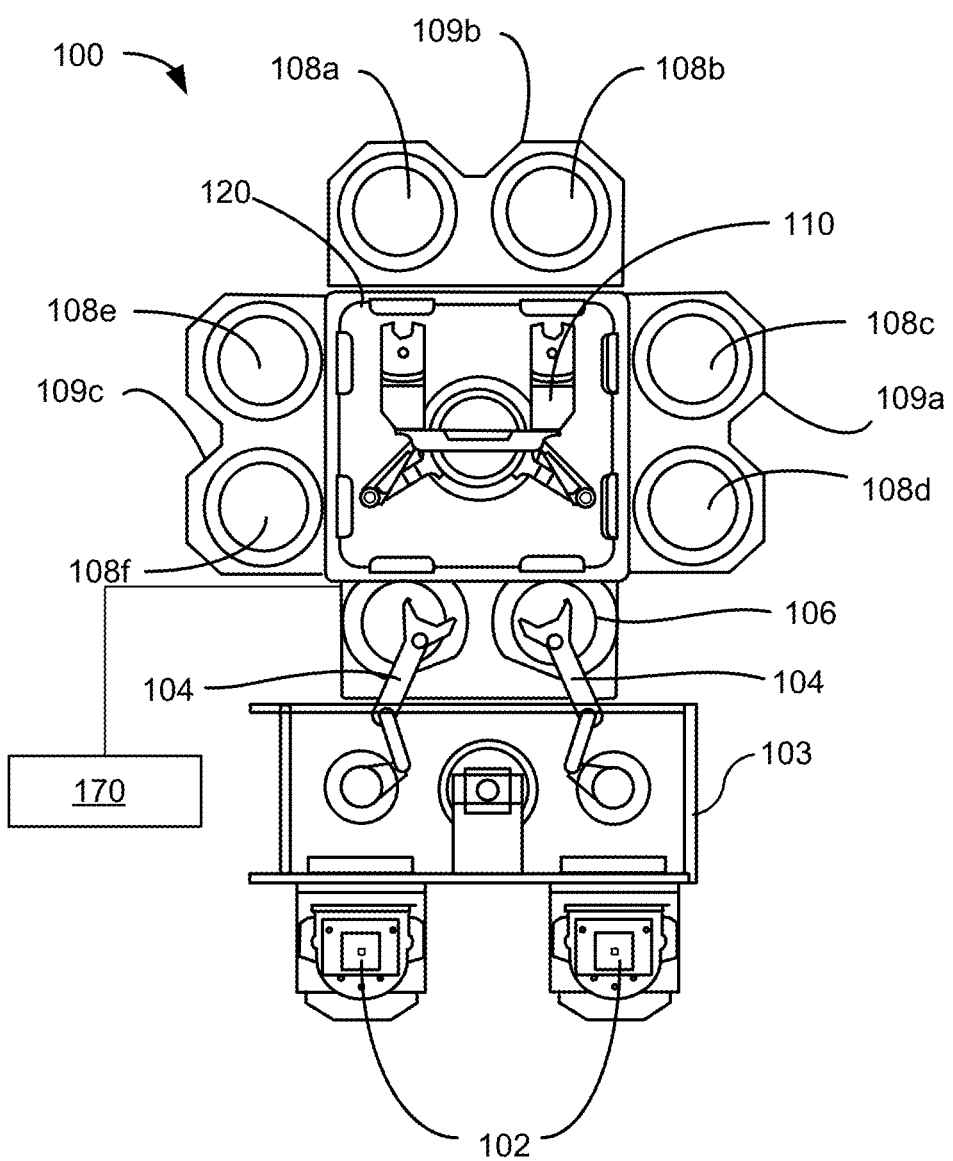
FIG. 1 shows a top plan view of an exemplary processing system according to embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

The present technology includes systems and processing methods to detect defects in deposited films on semiconductor substrates. Embodiments of the systems and methods include metrology operations to detect defects less than or about 10 nm in CVD deposited films using scanning electron microscopy. Embodiments of the metrology operations may further include sampling a substrate for defects at greater than or about two non-contiguous regions and using the sampling data to calculate a total number of defects in the film deposited on the substrate. The sampling data and calculated total number of defects may be used to adjust one or more deposition parameters so that subsequent depositions of the film will have fewer defects.

The present technology addresses a number of issues with conventional technology for detecting defects in films deposited on semiconductor substrates. Conventional metrology techniques often include increasing the size of defects by depositing an additional layer of material over an analyzed layer. The size expansion of the initial defect in the analyzed layer is required in order for the metrology equipment to detect small defects. For example, defects formed in the analyzed layer of less than or about 10 nm may be increased to greater than or about two-times the size, greater than or about two-times the size, or more, by the deposition of the additional layer. The enlarged defects may be detected by, for example, conventional metrology techniques that use atomic-force-microscopy to characterize the average roughness of the additional layer deposited over the analyzed layer.

These conventional techniques add time and complexity with the deposition of the additional layer to enlarge the smaller defects to a detectable size. The additional deposition also introduces defects that originated with the additional layer instead of the analyzed layer. In addition, the atomic-force-microscopy systems are often limited in the number of simultaneous samples they can take on the substrate. This may add additional time for the detection of the defects and a determination of the total number of defects across the deposited film.

Embodiments of the present technology overcome these and other issues with the conventional technology by using scanning electron microscopy to image the surface of the deposited film at two or more non-contiguous regions of the substrate and calculating a total number of defects in film. In embodiments, the non-contiguous regions may have a field of view that is greater than or about 5 µm across, and may be able to detect defects in the deposited film at a size that is less than or about 10 nm without the need for additional films to enlarge the size of the defects. In embodiments, the non-contiguous regions may be sampled near or at the same time to reduce the sampling time compared with conventional metrology techniques that sequentially sample the analyzed film. In further embodiments, the defect sampling data may be used to calculate a total number of defects in the deposited film. In still further embodiments, the calculation of the total number of defects in the film may be correlated with a set of deposition parameters used to deposit the film. One or more of the deposition parameters may be adjusted and the film analysis repeated to determine how the change in the parameter affects the defect count. In embodiments, this iterative analysis and adjustment technique provides a way to reduce the total number of defects in the film deposition process.

FIG. 1 shows a top plan view of one embodiment of a processing system 100 of deposition, etching, baking, and curing chambers according to embodiments of the present technology. In the figure, a pair of front opening unified pods 102 supply substrates of a variety of sizes that are received within a factory interface 103 by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including the dry etch processes described herein in addition to cyclical layer deposition, atomic layer deposition, chemical vapor deposition, physical vapor deposition, etch, pre-clean, degas, orientation, and other substrate processes.

The substrate processing chambers 108a-f may include one or more system components for depositing, annealing, curing and/or etching any number of metal or dielectric materials on the substrate wafer. In one configuration, two pairs of the processing chambers, e.g., 108c-d and 108e-f, may be used to deposit material on the substrate, and the third pair of processing chambers, e.g., 108a-b, may be used to etch the deposited materials. In another configuration, all three pairs of chambers, e.g., 108a-f, may be configured to etch a material layer on the substrate. Any one or more of the processes described may be carried out in one or more chamber separated from the fabrication system shown in different embodiments. It will be appreciated that additional configurations of deposition, etching, annealing, and curing chambers for dielectric films are contemplated by system 100. Any number of the structures or layers described throughout the present disclosure may be formed in one or more chambers incorporated with a system like system 100, or any other processing system in which semiconductor fabrication may be performed.

Additionally processing system 100 may include a processing device 170, which may be communicatively coupled with a defect detection system (not shown). The defect detection system may include a number of different components, and in some embodiments may include a scanning electron microscope for obtaining SEM images of regions of a substrate being processed through one or more of the processing chambers 108a-f. Processing device 170 may be a computer, server, or other computational device. In some embodiments, processing device 170 may be part of a semiconductor processing system server, as well as an internal processing unit of the defect detector system, which may be in communication with a system server. The coupling may be wired or wireless in embodiments, and may provide imaging data to the computer for processing and interpretation as will be described in detail below. Processing device 170 may have one or more processors for controlling any of the noted components. The processors may be communicatively coupled with memory and other storage or networking features. Processing device 170 may include neural networking features. Certain aspects of processing device 170 will be described in more detail below.

Cluster tools often process a number of substrates by continuously passing substrates through a series of chambers and process operations. The process recipes and sequences will typically be programmed into a microprocessor controller that will direct, control, and monitor the processing of each substrate through the cluster tool. In some embodiments, the microprocessor controller is integrated into the processing device 170. In some embodiments, the processing device 170 may provide instructions such as corrective actions to bring the wafers into uniformity based upon a calculated total number of defects in the deposition of a film that is determined by the defect detection system.

Figure 2:
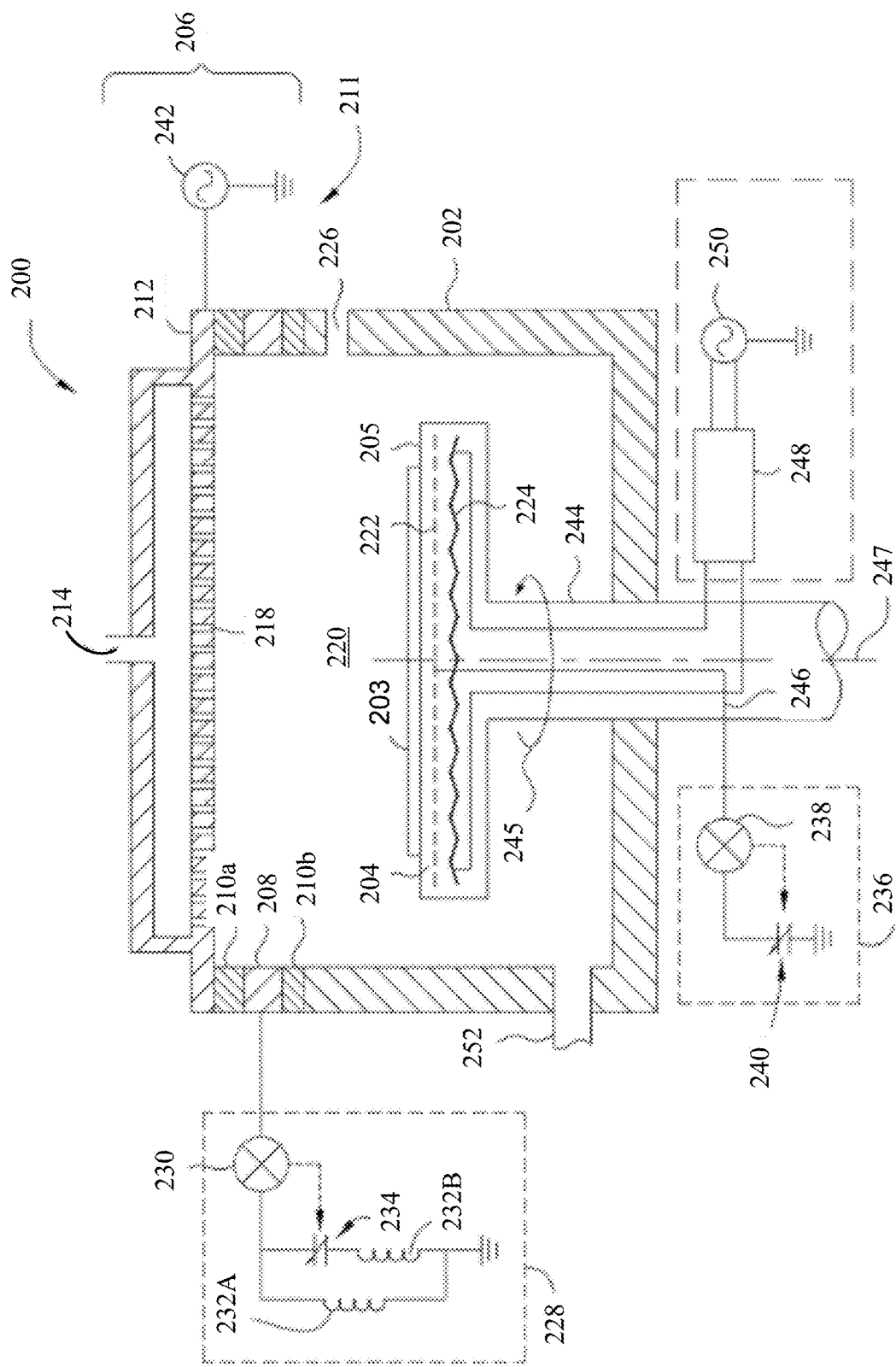
FIG. 2 shows a schematic cross-sectional view of an exemplary processing chamber according to some embodiments of the present technology.

FIG. 2 shows a cross-sectional view of an exemplary processing chamber 200 according to some embodiments of the present technology. The figure may illustrate an overview of a system incorporating one or more aspects of the present technology, and/or which may perform one or more operations according to embodiments of the present technology. Additional details of chamber 200 or methods performed may be described further below. Chamber 200 may be utilized to form film layers according to some embodiments of the present technology, although it is to be understood that the methods may similarly be performed in any chamber within which film formation may occur. The processing chamber 200 may include a chamber body 202, a substrate support 204 disposed inside the chamber body 202, and a lid assembly 206 coupled with the chamber body 202 and enclosing the substrate support 204 in a processing volume 220. A substrate 203 may be provided to the processing volume 220 through an opening 226, which may be conventionally sealed for processing using a slit valve or door.

The substrate 203 may be seated on a surface 205 of the substrate support during processing. The substrate support 204 may be rotatable, as indicated by the arrow 245, along an axis 247, where a shaft 244 of the substrate support 204 may be located. Alternatively, the substrate support 204 may be lifted up to rotate as necessary during a deposition process.

A plasma profile modulator 211 may be disposed in the processing chamber 200 to control plasma distribution across the substrate 203 disposed on the substrate support 204. The plasma profile modulator 211 may include a first electrode 208 that may be disposed adjacent to the chamber body 202, and may separate the chamber body 202 from other components of the lid assembly 206. The first electrode 208 may be part of the lid assembly 206, or may be a separate sidewall electrode. The first electrode 208 may be an annular or ring-like member, and may be a ring electrode. The first electrode 208 may be a continuous loop around a circumference of the processing chamber 200 surrounding the processing volume 220, or may be discontinuous at selected locations if desired. The first electrode 208 may also be a perforated electrode, such as a perforated ring or a mesh electrode, or may be a plate electrode, such as, for example, a secondary gas distributor.

One or more isolators 210a, 210b, which may be a dielectric material such as a ceramic or metal oxide, for example aluminum oxide and/or aluminum nitride, may contact the first electrode 208 and separate the first electrode 208 electrically and thermally from a gas distributor 212 and from the chamber body 202. The gas distributor 212 may define apertures 218 for distributing process precursors into the processing volume 220. The gas distributor 212 may be coupled with a first source of electric power 242, such as an RF generator, RF power source, DC power source, pulsed DC power source, pulsed RF power source, or any other power source that may be coupled with the processing chamber. In some embodiments, the first source of electric power 242 may be an RF power source.

The gas distributor 212 may be a conductive gas distributor or a non-conductive gas distributor. The gas distributor 212 may also be formed of conductive and non-conductive components. For example, a body of the gas distributor 212 may be conductive while a face plate of the gas distributor 212 may be non-conductive. The gas distributor 212 may be powered, such as by the first source of electric power 242 as shown in FIG. 2, or the gas distributor 212 may be coupled with ground in some embodiments.

The first electrode 208 may be coupled with a first tuning circuit 228 that may control a ground pathway of the processing chamber 200. The first tuning circuit 228 may include a first electronic sensor 230 and a first electronic controller 234. The first electronic controller 234 may be or include a variable capacitor or other circuit elements. The first tuning circuit 228 may be or include one or more inductors 232. The first tuning circuit 228 may be any circuit that enables variable or controllable impedance under the plasma conditions present in the processing volume 220 during processing. In some embodiments as illustrated, the first tuning circuit 228 may include a first circuit leg and a second circuit leg coupled in parallel between ground and the first electronic sensor 230. The first circuit leg may include a first inductor 232A. The second circuit leg may include a second inductor 232B coupled in series with the first electronic controller 234. The second inductor 232B may be disposed between the first electronic controller 234 and a node connecting both the first and second circuit legs to the first electronic sensor 230. The first electronic sensor 230 may be a voltage or current sensor and may be coupled with the first electronic controller 234, which may afford a degree of closed-loop control of plasma conditions inside the processing volume 220.

A second electrode 222 may be coupled with the substrate support 204. The second electrode 222 may be embedded within the substrate support 204 or coupled with a surface of the substrate support 204. The second electrode 222 may be a plate, a perforated plate, a mesh, a wire screen, or any other distributed arrangement of conductive elements. The second electrode 222 may be a tuning electrode, and may be coupled with a second tuning circuit 236 by a conduit 246, for example a cable having a selected resistance, such as 50 ohms, for example, disposed in the shaft 244 of the substrate support 204. The second tuning circuit 236 may have a second electronic sensor 238 and a second electronic controller 240, which may be a second variable capacitor. The second electronic sensor 238 may be a voltage or current sensor, and may be coupled with the second electronic controller 240 to provide further control over plasma conditions in the processing volume 220.

A third electrode 224, which may be a bias electrode and/or an electrostatic chucking electrode, may be coupled with the substrate support 204. The third electrode may be coupled with a second source of electric power 250 through a filter 248, which may be an impedance matching circuit. The second source of electric power 250 may be DC power, pulsed DC power, RF bias power, a pulsed RF source or bias power, or a combination of these or other power sources. In some embodiments, the second source of electric power 250 may be an RF bias power.

The lid assembly 206 and substrate support 204 of FIG. 2 may be used with any processing chamber for plasma or thermal processing. In operation, the processing chamber 200 may afford real-time control of plasma conditions in the processing volume 220. The substrate 203 may be disposed on the substrate support 204, and process gases may be flowed through the lid assembly 206 using an inlet 214 according to any desired flow plan. Gases may exit the processing chamber 200 through an outlet 252. Electric power may be coupled with the gas distributor 212 to establish a plasma in the processing volume 220. The substrate may be subjected to an electrical bias using the third electrode 224 in some embodiments.

Upon energizing a plasma in the processing volume 220, a potential difference may be established between the plasma and the first electrode 208. A potential difference may also be established between the plasma and the second electrode 222. The electronic controllers 234, 240 may then be used to adjust the flow properties of the ground paths represented by the two tuning circuits 228 and 236. A set point may be delivered to the first tuning circuit 228 and the second tuning circuit 236 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 228, 236 may have a variable impedance that may be adjusted using the respective electronic controllers 234, 240. Where the electronic controllers 234, 240 are variable capacitors, the capacitance range of each of the variable capacitors, and the inductances of the first inductor 232A and the second inductor 232B, may be chosen to provide an impedance range. This range may depend on the frequency and voltage characteristics of the plasma, which may have a minimum in the capacitance range of each variable capacitor. Hence, when the capacitance of the first electronic controller 234 is at a minimum or maximum, impedance of the first tuning circuit 228 may be high, resulting in a plasma shape that has a minimum aerial or lateral coverage over the substrate support. When the capacitance of the first electronic controller 234 approaches a value that minimizes the impedance of the first tuning circuit 228, the aerial coverage of the plasma may grow to a maximum, effectively covering the entire working area of the substrate support 204. As the capacitance of the first electronic controller 234 deviates from the minimum impedance setting, the plasma shape may shrink from the chamber walls and aerial coverage of the substrate support may decline. The second electronic controller 240 may have a similar effect, increasing and decreasing aerial coverage of the plasma over the substrate support as the capacitance of the second electronic controller 240 may be changed.

The electronic sensors 230, 238 may be used to tune the respective circuits 228, 236 in a closed loop. A set point for current or voltage, depending on the type of sensor used, may be installed in each sensor, and the sensor may be provided with control software that determines an adjustment to each respective electronic controller 234, 240 to minimize deviation from the set point. Consequently, a plasma shape may be selected and dynamically controlled during processing. It is to be understood that, while the foregoing discussion is based on electronic controllers 234, 240, which may be variable capacitors, any electronic component with adjustable characteristic may be used to provide tuning circuits 228 and 236 with adjustable impedance.

Figure 3:
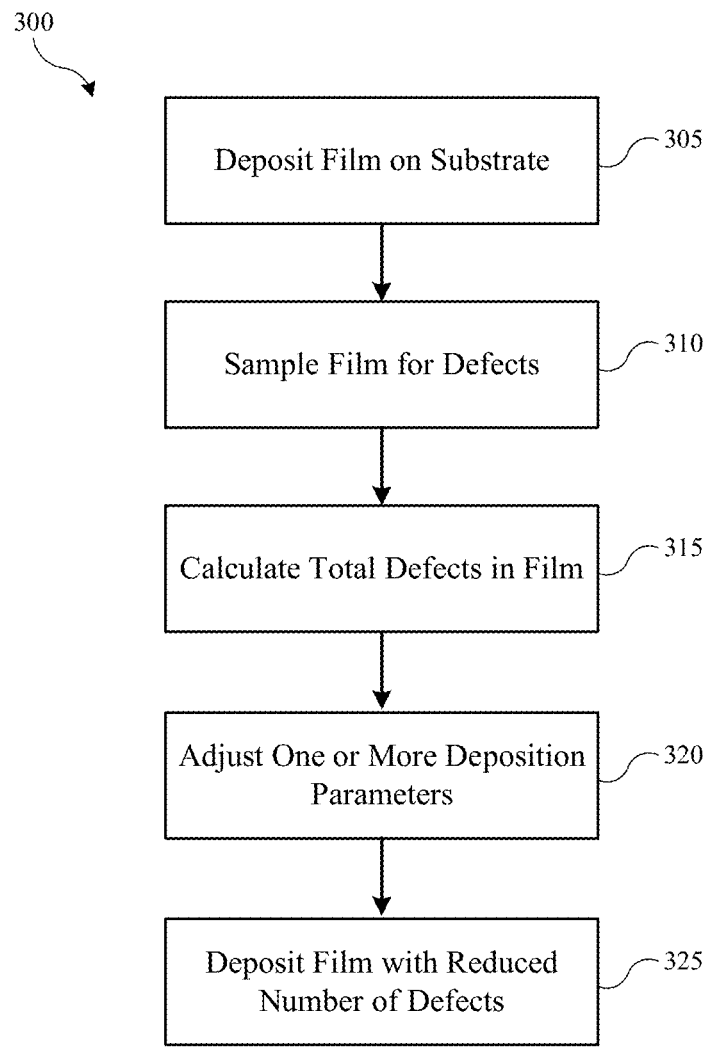
FIG. 3 shows exemplary operations in a defect analysis and correction method according to some embodiments of the present technology.

FIG. 3 shows exemplary operations in a method 300 for analyzing and reducing defects in a film deposited on a substrate according to embodiments of the present technology. Method 300 may include operations prior to the film deposition and defect sampling in some embodiments. For example, prior to the deposition of the analyzed film, the substrate may have one or more deposition and/or etching operations performed as well as any planarization or other process operations performed. Method 300 may include a number of operations that may be performed automatically within a system to limit manual interaction, and to provide increased efficiency and precision over manual operations.

In embodiments, method 300 may include depositing a film on a substrate at operation 305. In some embodiments, the film may be deposited by a chemical vapor deposition process. In further embodiments, the deposited film may be a dielectric film that includes one or more of silicon oxide, doped silicon oxide, silicon-carbon-oxides, silicon nitrides, and silicon oxynitrides, among other dielectric materials. In yet further embodiments, the deposited film may have a thickness that is greater than or about 20 Å, greater than or about 30 Å, greater than or about 50 Å, greater than or about 100 Å, greater than or about 150 Å, greater than or about 200 Å, or more.

In additional embodiments, the substrate upon which the film is deposited may be planar, structured-in-part and planar-in-part, or structured with substrate features throughout. In embodiments, a partially- or fully-structured substrate may include substrate features such as trenches, steps, gaps, and openings, among other substrate features. The substrate features may be part or all of one or more semiconductor device structures formed in the substrate. In embodiments, the substrate may include a bare substrate wafer made of one or more materials such as silicon, doped silicon, silicon carbide, gallium arsenide, and gallium nitride, among other substrate materials. In further embodiments, the substrate may include one or more layers of material formed on the bare substrate wafer. In embodiments, the one or more layers may independently include conductive materials, and electrically-insulating dielectric materials, among other materials.

Figure 5:
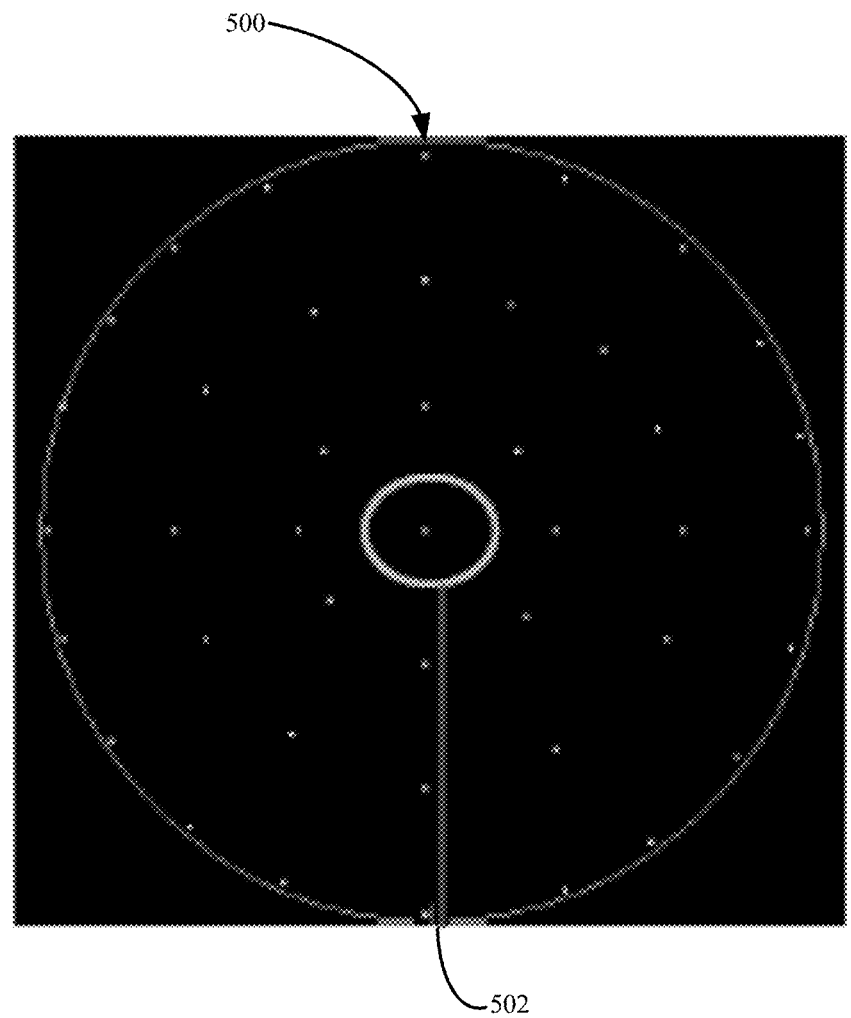
FIG. 5 shows an exemplary distribution of non-contiguous substrate sampling regions according to embodiments of the present technology.

In further embodiments, method 300 may include sampling the deposited film for defects at operation 310. The sampling may be done at one or more regions of the substrate upon which the film is deposited. In embodiments, the sampling may be done at greater than or about two regions of the substrate. In further embodiments, the number of sampled regions on the substrate may include greater than or about five, greater than or about 10, greater than or about 20, greater than or about 30, greater than or about 40, greater than or about 50, greater than or about 60, greater than or about 70, greater than or about 80, greater than or about 90, greater than or about 100, greater than or about 120, greater than or about 150, greater than or about 200, or more. In yet further embodiments, the two or more sampled regions may be non-contiguous. An embodiment of a sampling pattering is shown in FIG. 5 below.

Figure 6:
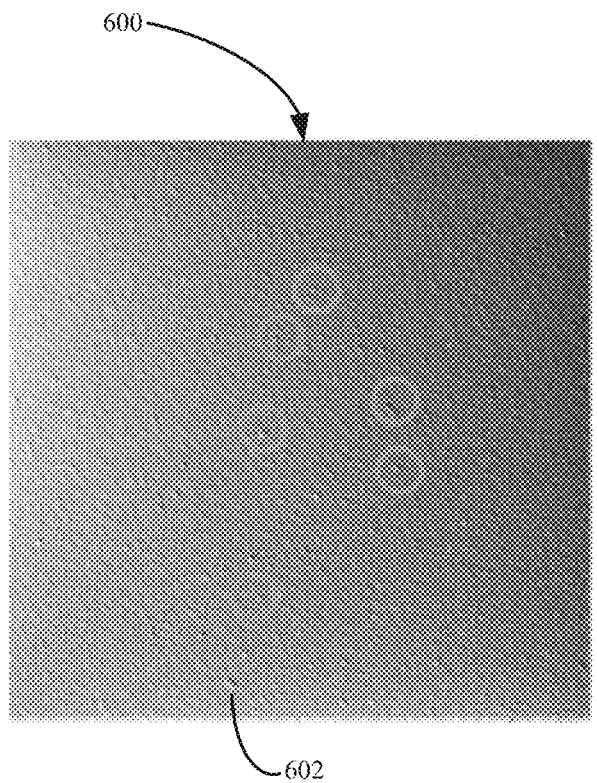
FIG. 6 shows an exemplary SEM image of a deposited film with a number of sub-10 nm defects identified according to some embodiments of the present technology.

In embodiments, a surface of each sampled region may be scanned by a scanning electron microscope to produce an image of the region. In additional embodiments, each sampled region may be scanned across a field of view that is greater than or about 1 μm, greater than or about 2 μm, greater than or about 3 μm, greater than or about 4 μm, greater than or about 5 μm, or more. In still additional embodiments, the shape of the field of view may be circular, elliptical, square, or rectangular, among other shapes. An example of a square-shaped sampled region of a deposited film across a 5 μm field of view is shown in FIG. 6.

The sampled region may include one or more defects in the deposited film. In embodiments, the present technology may identify defects having a size of less than or about 10 nm from an analysis of the image of a sampled region. In further embodiments, identified defects may have a size less than or about 9 nm, less than or about 8 nm, less than or about 7 nm, less than or about 6 nm, less than or about 5 nm, or less. The defects may be detected without enlargement by depositing an additional film on the analyzed film that increases the size of the defects in the analyzed film. In embodiments, the number of small defects characterized by a size of less than or about 10 nm that may be detected in a sampled region may be greater than or about one defect, greater than or about two defects, greater than or about five defects, greater than or about ten defects, or more.

In embodiments, the defects may be detected by measuring a signal intensity along a surface profile of the substrate. In further embodiments, the surface profile may be a side profile of the substrate that shows a higher signal intensity from a defect than an average surface roughness of the substrate. In embodiments, a signal intensity from a defect relative to the average signal intensity from the substrate surface may be greater than or about 10%, greater than or about 15%, greater than or about 20%, greater than or about 25%, greater than or about 30%, greater than or about 35%, greater than or about 40%, greater than or about 45%, greater than or about 50%, greater than or about 75%, greater than or about 100%, or more. In still further embodiments, the signal may be generated by the detection of electrons that are scattered from the surface of the substrate by SEM equipment.

In additional embodiments, the defects in a sampled region may be identified by converting the SEM images into values correlated to pixel color or intensity variation. This operation may be performed using a processing device to translate the pixel values collected from the SEM images to intensity variation plots. In further embodiments, an SEM image may be mapped as a greyscale image with each pixel's brightness translated into an 8-bit value from 0 to 255, with 0 representing darkest and 255 representing brightest. In embodiments, an algorithm may calculate an average brightness for the grayscale image and may further use the average brightness value to calibrate a minimum threshold value of brightness for the indication of a defect. In yet further embodiments, the algorithm may analyze the pixels adjacent to a pixel with a brightness value exceeding a threshold value to determine whether the bright pixel may represent an detection artifact or an actual defect on the substrate surface. The processing device may further be employed to compare the pixel value data to reference library data. In some embodiments, the reference library data may be continuously updated and refined using data acquired from defect detection systems according to embodiments of the present technology.

Embodiments of method 300 may further include calculating the total defects in the deposited film at operation 315. In embodiments, this operation may include detecting and counting a number of defects in each of the regions sampled in operation 310, and extrapolating from the number of detected defects to calculate the total defects in the deposited film. In embodiments, the total number of defects calculated may be greater than or about one defect, greater than or about two defects, greater than or about five defects, greater than or about ten defects, greater than or about 25 defects, greater than or about 50 defects, greater than or about 75 defects, greater than or about 100 defects, greater than or about 125 defects, greater than or about 150 defects, greater than or about 175 defects, greater than or about 200 defects, greater than or about 500 defects, greater than or about 1000 defects, greater than or about 5000 defects, greater than or about 10,000 defects, greater than or about 15,000 defects, greater than or about 20,000 defects, or more.

In embodiments of method 300, the method may also include adjusting one or more deposition parameters in a subsequent deposition of the film at operation 320. The one or more deposition parameters may include a deposition temperature, a deposition pressure, an amount of spacing between the substrate and a showerhead in the substrate processing region, and a flow rate ratio of two or more deposition precursors. In embodiments that include a plasma-enhanced chemical vapor deposition of the film, the one or more deposition parameters may further include a power used to generate the deposition plasma, and a frequency of the power used to generate the deposition plasma, among other adjustable parameters for the deposition plasma.

In embodiments of method 300, a subsequent film may be deposited following the adjustment of the one or more deposition parameters at operation 325. The subsequently deposited film may have a reduced total number of defects compared to the previously deposited film that was analyzed for defects using embodiments of the present technology. In embodiments, the subsequently deposited film may be deposited on a different substrate than the previously deposited film. In further embodiments, the total number of defects calculated in the subsequently deposited film compared to the previously deposited film may be less than or about 95%, less than or about 90%, less than or about 80%, less than or about 70%, less than or about 60%, less than or about 50%, less than or about 40%, less than or about 30%, less than or about 20%, less than or about 10%, less than or about 5%, or less. In yet further embodiments, the total number of defects calculated in the subsequently deposited film compared to the previously deposited film may be less than or about 10,000 defects, less than or about 5000 defects, less than or about 2500 defects, less than or about 1500 defects, less than or about 1000 defects, or less.

In embodiments of the present technology, methods may further include "flagging" a deposited film as passing or failing based on a total number of calculated defects in the film. A processing device may then optionally provide corrective actions such as adjusting one or more adjusting one or more deposition parameters. In additional embodiments, the processing device may include a neural network that may provide a model for generating outputs based on a flagged deposited film. The model may be BKM algorithm based or shift-and-add algorithm based. The processing device may continually update data to expand the reference library database. The processing device may be trained to recognize deviations in the deposited films as well as trends to provide corrective actions. In embodiments, the deviations may be correlated to one or more of the deposition parameters. In further embodiments, the deviations may be correlated to one or more characteristics of the substrate such as stress, bow, and thickness, among other substrate characteristics. Corrective actions may include individual actions or actions related to processing parameters based upon trends showing deviations from reference library data. In some embodiments, individual correction may include wafer rejection such as tagging a specific wafer or series of wafers for removal from further production based upon one or more identified deviations. Trends that indicate intensities progressively deviating from reference library data may provide indication that a process recipe needs to be augmented, and/or a chamber requires cleaning, and/or a showerhead or other component replacement is recommended. Trends identified may greatly improve process efficiencies. Rather than cleaning chambers at prescribed intervals, cleaning may be postponed until data trends observe deviations. This may either extend the time between scheduled cleanings, or identify a cleaning requirement prior to loss of substrates due to out-of-tolerance processing. This may also improve chamber uptime, by reducing the frequency of qualification runs or part maintenance.

Figure 4:
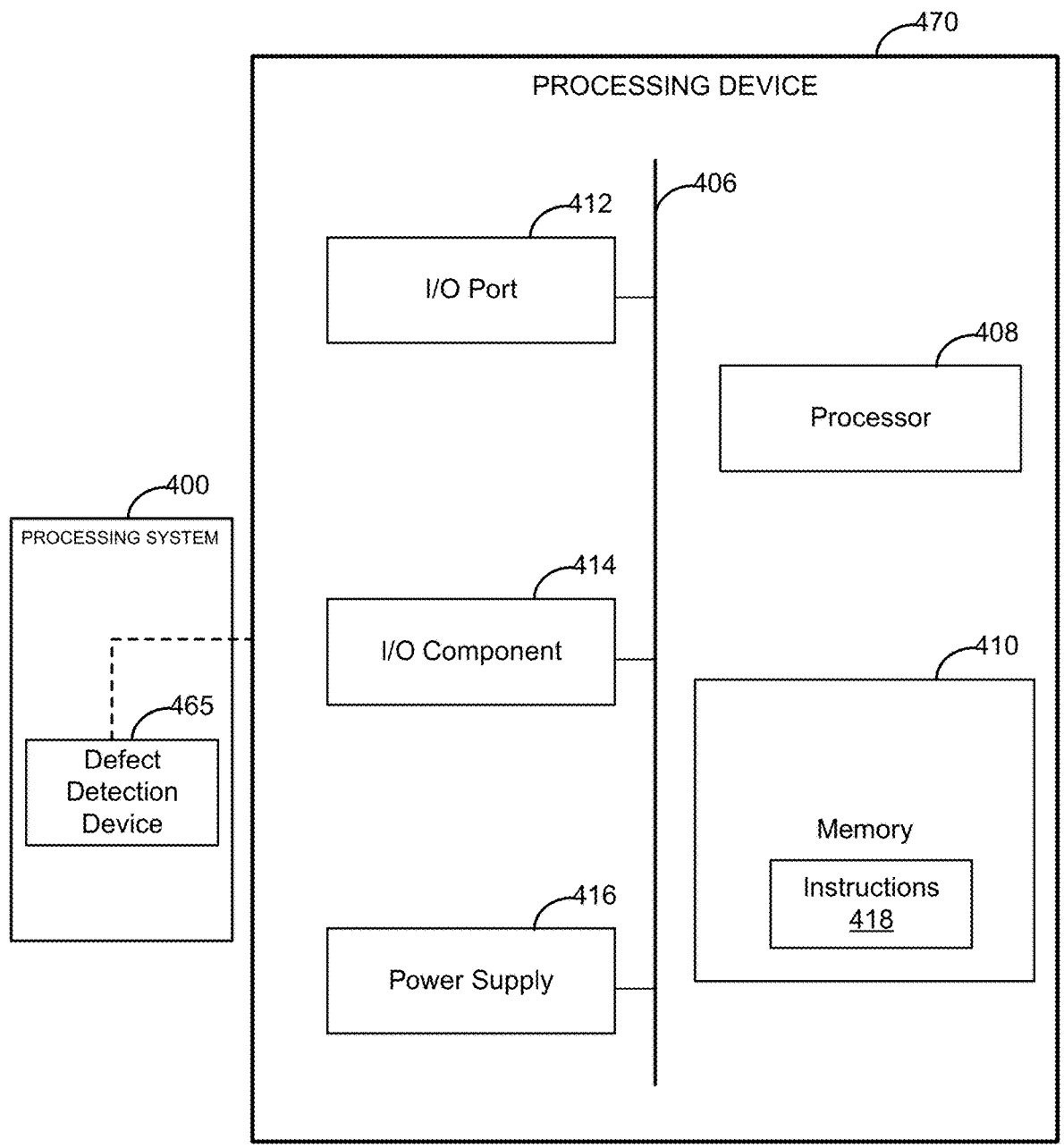
FIG. 4 shows a block diagram depicting an illustrative control system according to some embodiments of the present technology.

FIG. 4 shows a block diagram depicting an illustrative processing system 400 for non-uniformity control according to some embodiments of the present technology. As shown, the system 400 may include a defect detection device 465. The defect detection device may be configured to receive defect sampling data. In some embodiments, the processing system 400 may be, be similar to, include, or be included within the system 100 and/or any of its components depicted in FIG. 1. In additional embodiments the processing system 400 may be separate from the system 100.

The system 400 may further include a processing device 470 communicatively coupled to defect detection device 465. Processing device 470 may be configured to translate SEM images received by the defect detection device 465, convert and analyze pixel color and intensity data, compare pixel variation data to reference library data, identify one or more deviations from reference library data, and provide corrective actions based on deviations identified. The processing device 470 may include any type of computing device suitable for implementing aspects of embodiments of the present technology. Examples of computing devices include specialized computing devices or general-purpose computing devices such as workstations, servers, laptops, desktops, tablet computers, hand-held devices, smartphones, general-purpose graphics processing units, and the like, all of which are encompassed within the scope of FIG. 4. Processing device 470 may include a neural network as described above for continually expanding a data set for feed forward recognition.

In some embodiments, the processing device 470 may include a bus 406 that, directly and/or indirectly, couples the following devices: a processor 408, a memory 410, an input/output (I/O) port 412, an I/O component 414, and a power supply 416. Any number of additional components, different components, and/or combinations of components may also be included in the processing device 470. The I/O component 414 may include a presentation component configured to present information to a user such as, for example, a display device, a speaker, a printing device, and/or the like, and/or an input component such as, for example, a microphone, a joystick, a satellite dish, a scanner, a printer, a wireless device, a keyboard, a pen, a voice input device, a touch input device, a touch-screen device, an interactive display device, a mouse, and/or the like. The bus 406 represents what may be one or more busses, such as, for example, an address bus, data bus, or some combination of these or other components. Similarly, in some embodiments, the processing device 470 may include a number of processors 408, a number of memory components 410, a number of I/O ports 412, a number of I/O components 414, and/or a number of power supplies 416. Additionally any number of these components, or combinations thereof, may be distributed and/or duplicated across a number of computing devices. In some embodiments, the processor 408 may load the pixel variation data into the memory 410 to compare to pixel variation data to reference library data.

In some embodiments, the memory 410 includes computer-readable media in the form of volatile and/or nonvolatile memory and may be removable, nonremovable, or a combination thereof. Media examples include Random Access Memory (RAM); Read Only Memory (ROM); Electronically Erasable Programmable Read Only Memory (EEPROM); flash memory; optical or holographic media; magnetic cassettes, magnetic tape, magnetic disk storage or other magnetic storage devices; data transmissions; and/or any other medium that can be used to store information and can be accessed by a computing device such as, for example, quantum state memory, and/or the like. In embodiments, the memory 410 may store computer-executable instructions 418 for causing the processor 408 to implement aspects of embodiments of system components discussed herein and/or to perform aspects of embodiments of methods and procedures discussed herein.

The computer-executable instructions 418 may include, for example, computer code, machine-useable instructions, and the like such as, for example, program components capable of being executed by one or more processors 408 associated with the processing device 470. For example, in embodiments, the computer-executable instructions 418 may be configured to cause the one or more processors 408 to initiate an application configured to facilitate any number of different aspects of identifying and reducing small defects in deposited films and for implementing aspects of embodiments of the present technology. Program components may be programmed using any number of different programming environments, including various languages, development kits, frameworks, and/or the like. Some or all of the functionality contemplated herein may also, or alternatively, be implemented in hardware and/or firmware.

The illustrative system 400 shown in FIG. 4 is not intended to suggest any limitation as to the scope of use or functionality of embodiments of the present technology. The illustrative system 400 also should not be interpreted as having any dependency or requirement related to any single component or combination of components illustrated therein. Additionally, various components depicted in FIG. 4 may be, in embodiments, integrated with various ones of the other components depicted therein and/or components not illustrated, all of which are considered to be encompassed by the present technology.

As noted above, the FIG. 5 shows schematically a substrate 500 with a distribution of non-contiguous sampling regions 502 according to an embodiment of the present technology. In the embodiment shown, there are 42 sampling regions 502 radially distributed around a sampling region at the center of a circular-shaped substrate. The 50 sampling regions are radially arranged in three concentric groups around the center sampling region. The first group that is closest to the center sampling region has eight non-contiguous sampling regions. The second group that is between the first group and third group furthest from the center sampling region has 14 non-contiguous sampling regions. The third group furthest from the center sampling region has 19 non-contiguous sampling regions. In additional embodiments, the total number of sampling regions may be greater than or about 50, greater than or about 60, greater than or about 70, greater than or about 80, greater than or about 90, greater than or about 100, or more. In still additional embodiments, the total number of sampling regions may be arranged in concentric circles around a center sampling region, where the number of concentric circles may be greater than or about three, greater than or about four, greater than or about five, greater than or about six, greater than or about seven, greater than or about eight, greater than or about 9, greater than or about ten, or more.

FIG. 6 shows an SEM image 600 of a sampling region according to embodiments of the present technology. In the embodiment shown, the field of view for the SEM image is 5 μm per side of a square-shaped image. The SEM image 600 includes eight identified defects having a size less than 10 nm. As noted above, the defects may be detected from the image background by mapping the SEM image as a grayscale image made of a number of pixels. In embodiments, each pixel may be assigned an 8-bit brightness value ranging from 0 to 255, with 0 being darkest and 255 being brightest. In further embodiments, defects may be detected as pixels having a brightness value that exceeds a background value calculated for the grayscale image. In some embodiments, an algorithm may include additional calculations of pixels surrounding the defect pixel to determine whether the defect pixel is a detection artifact or an actual defect on the surface of the substrate. In still additional embodiments, the algorithm may display indicia on at least one of the grayscale image and the SEM image 600 to highlight the presence of the defects.

Embodiments of the present technology permit an efficient analysis for small-sized defects of 10 nm or less in deposited films. The defect data collected from sampled regions a substrate supporting the deposited film may be used to calculate a total number of these small-sized defects in film. The measured and calculated defect data may be used to adjust one or more deposition parameters in subsequent film depositions so that the subsequently deposited film has fewer defects than the analyzed film. Embodiments of these systems and methods may perform this analysis without having to enlarge the small defects with an additional deposition of material, or the use of time-consuming and complex atomic-force microscopy. In embodiments, the systems and methods may perform several iterative film deposition analyses and adjustments to develop a film deposition process that fabricates films with significantly fewer defects than the originally deposited film.

One or more computing devices or components may be adapted to provide some of the desired functionality described herein by accessing software instructions rendered in a computer-readable form. The computing devices may process or access signals for operation of one or more of the components of the present technology, such as the defect detection system, for example. When software is used, any suitable programming, scripting, or other type of language or combinations of languages may be used to perform the processes described. However, software need not be used exclusively, or at all. For example, some embodiments of the present technology described above may also be implemented by hard-wired logic or other circuitry, including but not limited to application-specific circuits. Combinations of computer-executed software and hard-wired logic or other circuitry may be suitable as well.

Some embodiments of the present technology may be executed by one or more suitable computing device adapted to perform one or more operations discussed previously. As noted above, such devices may access one or more computer-readable media that embody computer-readable instructions which, when executed by at least one processor that may be incorporated in the devices, cause the at least one processor to implement one or more aspects of the present technology. Additionally or alternatively, the computing devices may comprise circuitry that renders the devices operative to implement one or more of the methods or operations described.

Any suitable computer-readable medium or media may be used to implement or practice one or more aspects of the present technology, including but not limited to, diskettes, drives, and other magnetic-based storage media, optical storage media, including disks such as CD-ROMS, DVD-ROMS, or variants thereof, flash, RAM, ROM, and other memory devices, and the like.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a layer" includes a plurality of such layers, and reference to "the material" includes reference to one or more materials and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
depositing a film of semiconductor material on a substrate in a substrate processing chamber;
sampling for defects in the deposited film at greater than or about two non-contiguous regions of the substrate with scanning electron microscopy, wherein the defects are characterized by a size less than or about 10 nm;
calculating a total number of defects in the deposited film based on the sampling for defects in the greater than or about two non-contiguous regions of the substrate; and
adjusting at least one deposition parameter chosen from deposition temperature, deposition pressure, an amount of spacing between the substrate and a showerhead in the substrate processing chamber, and a flow rate ratio of two or more deposition precursors, wherein the adjustment to the at least one deposition parameter reduces the total number of defects in a deposition of the film of semiconductor material.

2. The semiconductor processing method of claim 1, wherein the adjusting of the at least one deposition parameter reduces the total number of defects in a subsequently-deposited film of the semiconductor material by greater than or about 80%.

3. The semiconductor processing method of claim 1, wherein the sampled film of semiconductor material is characterized by a calculated total number of defects greater than or about 10,000, and the adjustment to the at least one deposition parameter reduces the calculated total number of defects in a subsequently-deposited film of the semiconductor material to less than or about 2000.

4. The semiconductor processing method of claim 1, wherein the adjusting of the at least one deposition parameter reduces an average surface roughness in a subsequently-deposited film of the semiconductor material by greater than or about 50%.

5. The semiconductor processing method of claim 1, wherein the non-contiguous regions that are sampled for defects in the deposition film are characterized by a field of view of about 5 µm.

6. The semiconductor processing method of claim 1, wherein the substrate upon which the film of semiconductor material is deposited is a planar substrate.

7. The semiconductor processing method of claim 1, wherein the deposited film of semiconductor material comprises a silicon-containing dielectric material.

8. The semiconductor processing method of claim 1, wherein the deposited film of semiconductor material is characterized by a thickness of less than or about 50 Å.

9. A semiconductor processing method comprising:
depositing a film of silicon oxide on a substrate in a substrate processing chamber, wherein the silicon oxide film is characterized by a thickness of less than or about 50 Å;
sampling for defects in the deposited silicon oxide film at greater than or about two non-contiguous regions of the substrate with scanning electron microscopy, wherein the defects are characterized by a size less than or about 10 nm; and
adjusting at least one deposition parameter chosen from deposition temperature, deposition pressure, an amount of spacing between the substrate and a showerhead in the substrate processing chamber, and a flow rate ratio of two or more deposition precursors, wherein the adjustment to the at least one deposition parameter reduces the number of defects sampled in a subsequent deposition of the silicon oxide film.

10. The semiconductor processing method of claim 9, wherein the deposited silicon oxide layer is sampled for defects in the absence of an over layer that increases the size of the defects.

11. The semiconductor processing method of claim 9, wherein the deposited silicon oxide layer is sampled for defects before a post-deposition anneal of the silicon oxide layer.

12. The semiconductor processing method of claim 9, wherein the greater than or about two non-contiguous regions of the substrate are planar regions of the substrate.

13. The semiconductor processing method of claim 9, wherein the sampled silicon oxide film is characterized by a total number of defects greater than or about 20,000, and the adjustment to the at least one deposition parameter reduces the total number of defects in a subsequently-deposited silicon oxide film to less than or about 1000.

14. The semiconductor processing method of claim 9, wherein the adjustment to the at least one deposition parameter comprises reducing deposition pressure and increasing a flow rate ratio of a silicon-containing precursor to a non-silicon-containing precursor.

15. A semiconductor processing system comprising:
a deposition chamber to deposit a film of semiconductor material on a substrate in the deposition chamber;
a defect sampling unit comprising a scanning electron microscope, wherein the defect sampling unit is operable to receive the substrate with the deposited film of semiconductor material and sample the substrate for defects in the deposited film at greater than or about two non-contiguous regions of the substrate; and
a control unit in electronic communication with the deposition chamber to control one or more deposition parameters chosen from deposition temperature, deposition pressure, an amount of spacing between the substrate and a showerhead in the substrate processing chamber, and a flow rate ratio of two or more deposition precursors, wherein the control unit adjusts at least one of the deposition parameters in response to a number of defects in the deposited film of semiconductor material detected by the defect sampling unit so that a subsequent deposition of the film of semiconductor material has a reduced number of defects.

16. The semiconductor processing system of claim 15, wherein the defects in the film of semiconductor material that are sampled by the defect sampling unit are characterized by a size less than or about 10 nm.

17. The semiconductor processing system of claim 15, wherein the non-contiguous regions that are sampled for defects by the defect sampling unit are characterized by a field of view greater than or about 5 µm.

18. The semiconductor processing system of claim 15, wherein the defect sampling unit samples the substrate at greater than or about ten non-contiguous regions that are equally spaced from each other around the substrate.

19. The semiconductor processing system of claim 15, wherein the greater than or about two non-contiguous regions of the substrate are planar regions of the substrate.

20. The semiconductor processing system of claim 15, wherein the defect sampling unit further comprises programmable logic that calculates a total number of defects in the deposited film on the substrate based on a number of sampled defects detected by the defect sampling unit, and wherein the control unit adjusts the at least one of the deposition parameters in response to the total number of defects calculated by the programmable logic of the defect sampling unit.

* * * * *